United States Patent [19]
Bouayad-Amine et al.

[11] Patent Number: 5,136,977
[45] Date of Patent: Aug. 11, 1992

[54] APPARATUS FOR DEPOSITING DIELECTRIC FILMS

[75] Inventors: Jamal Bouayad-Amine, Ludwigsburg; Wolfgang Kuebart, Stuttgart; Joachim Scherb, Esslingen-Zell; Alfred Schönhofen, Bietigheim-Bissingen, all of Fed. Rep. of Germany

[73] Assignee: Alcatel N.V., Amsterdam, Netherlands

[21] Appl. No.: 523,528

[22] Filed: May 15, 1990

[30] Foreign Application Priority Data

Jun. 5, 1989 [DE] Fed. Rep. of Germany ....... 3918256

[51] Int. Cl.$^5$ .......................................... C23C 16/50
[52] U.S. Cl. ..................................... 118/723; 118/50.1
[58] Field of Search ............................... 118/723, 50.1

[56] References Cited

U.S. PATENT DOCUMENTS 4,526,805 7/1985 Yoshizawa ........................... 118/723

FOREIGN PATENT DOCUMENTS 58-202533 11/1983 Japan .................................... 118/723

OTHER PUBLICATIONS

Schachter et al., Summary Abstract: Passivation of InP by plasma deposited phosphorus: Effects of surface treatment, J. Vac. Sci. Technol. B 4(4), pp. 1128-1129, Jul./Aug. 1986.

Jackson et al., Afterglow Chemical Vapor Deposition of SiO$_2$, Solid State Technology, pp. 107-111, Apr. 1987.

Kulisch et al., Reduction of the concentration of slow insulator states in SiO$_2$/InP metal-insulator semiconductor structures, J. Vac. Sci. Technol. B 5(2), pp. 523-529, Mar./Arp. 1987.

Primary Examiner—Richard Bueker
Attorney, Agent, or Firm—Spencer, Frank & Schneider

[57] ABSTRACT

An apparatus is disclosed for the application of dielectric films to a surface according to the so-called PECVD (plasma enhanced chemical vapor deposition) process.

By means of a shield (T) disposed in a simple parallel plate reactor, direct contact of the surfaces (PR) to be coated with the plasma, and thus damage to the resulting films due to the action of the plasma is avoided.

If the shield is in a movable arrangement, it can be removed during the coating process or its position can be changed. It then becomes possible to apply layers alternatingly with the use of the shield, or in a time saving manner, in direct contact with the plasma.

17 Claims, 1 Drawing Sheet

APPARATUS FOR DEPOSITING DIELECTRIC FILMS

CROSS REFERENCE TO RELATED APPLICATION

This application claims the priority of Application Ser. No. P 39 18 256.8, filed Jun. 5, 1989, in the Federal Republic of Germany, the subject matter of which is incorporated herein by reference.

BACKGROUND OF THE INVENTION

The invention relates to apparatus for depositing a dielectric film.

Such devices have been known for some time for the deposition of dielectric films according to the so-called plasma enhanced chemical vapor deposition (PECVD) process.

In the chemical vapor deposition (CVD) process, the reaction partners are combined into the substance forming the film either by already being present in the gas chamber above the surface to be coated, in which case the substance is then deposited on the surface as a condensate (homogeneous reaction), or they are combined only directly on the surface to be coated, with the latter possibly catalytically supporting the process (heterogeneous reaction).

When the PECVD process was employed, it was noted repeatedly that in cases in which the surfaces to be coated were subjected directly to the plasma, the resulting films were damaged to a greater or lesser degree. (See, for example, Schachter et al, J. Vac. Sci. Technol. B4 (1986), pages 1128–1129).

An improvement in the quality of the films was realized with special plasma reactors which have a plasma chamber that is separated from the reaction chamber containing the samples to be coated, known as remote reactors. Thus, in "Solid State Technology," April (1987), page 107, a reactor is described which employs a very complicated excitation by means of electron cyclotron resonance in the magnetic field. In "J. Vac. Sci. Technology," B5 (2), March/April, 1987, a reactor is disclosed in which a plasma is generated by HF excitation and the surfaces to be coated are disposed in a reaction chamber adjacent to the plasma chamber. Electrical shielding against the plasma for the surfaces to be coated does not occur there. The "shutter" shown in FIG. 2 serves only to protect against the deposition of impurities.

The above described reactors are very expensive and demand the precise adherence to many parameters, such as gas composition and throughput, sample temperature and plasma characteristics.

SUMMARY OF THE INVENTION

It is the object of the invention to provide an apparatus with which dielectric films can be produced according to the PECVD process while employing a simple parallel plate reactor, such dielectric films having the same or a better quality compared to the prior art.

This is accomplished by an apparatus for depositing a dielectric film to a surface of a sample. The apparatus is made of a reaction vessel, an inlet pipe and an extraction pipe, each connected to the reaction vessel. Parallel electrode plates are present in the reaction vessel for generating a plasma. Electrical terminals are provided connected to the electrode plates and leading outside of the reaction vessel. A metal shielding plate is disposed between the plasma and the extraction pipe. A substantially plasma-free area is thereby created on the side of the shielding plate facing away from the plasma, with the samples to be coated being disposed in the plasma-free area.

Additionally, it is possible, after the application of a thin base layer, to effect the further application of films in direct contact with the plasma.

Further, good utilization of the reaction vessel with respect to the space that can be used to accommodate the surfaces to be coated.

Continuous changes in the plasma effect on the surfaces to be coated are possible, as well as, changes within wide limits in the plasma itself and in the area filled by the plasma.

Another modification of the apparatus according to the invention permits the direct supply of process gas into the plasma-shielded chamber.

BRIEF DESCRIPTION OF THE DRAWINGS

Embodiments of the apparatus according to the invention will now be described with reference to two drawing figures and their operation will be explained.

DETAILED DESCRIPTION OF THE PREFERRED EMBODIMENT

Figure 1:
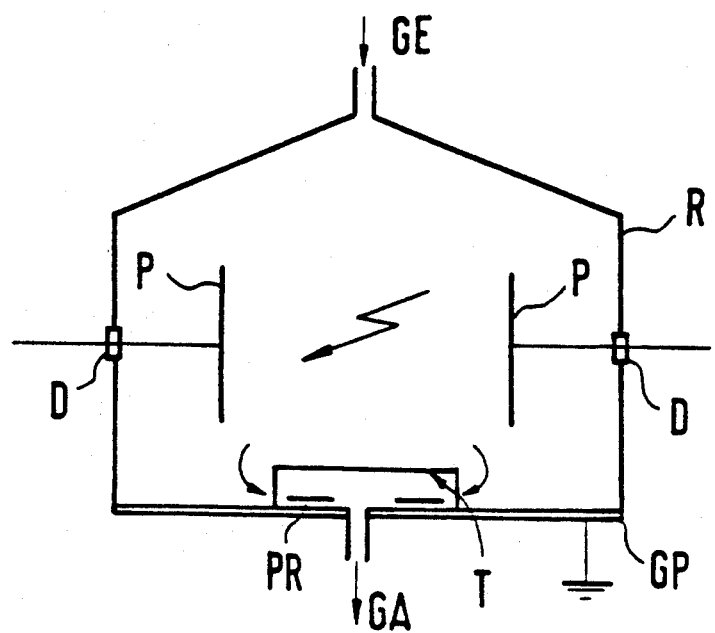
FIG. 1 is a schematic representation of the apparatus according to the invention including a parallel plate reactor in a horizontal arrangement and a tunnel-shaped sample shield.

FIG. 1 is a schematic illustration of a reaction vessel R and its gas inlet pipe GE as well as its gas extraction pipe GA. Facing one another horizontally, two metal plates P are disposed in the reaction vessel and their electrical terminals are brought to the outside through insulated vacuum passages D. The metal base plate GP of the reaction vessel is grounded so as to prevent an electrical charge in the form of charge carriers exiting from a plasma generated between plates P.

A shielding plate T bent in the form of a tunnel, its concave side down, is disposed above the gas extraction pipe GA inserted into the middle of the base plate. The samples PR to be coated are disposed below this shielding plate.

To apply the coating, a gas mixture composed of a carrier gas, e.g. argon, and the starting materials, e.g. $SiH_4$ and $N_2O$, required to produce the desired film is initially introduced through the gas inlet pipe GE. Then a voltage is applied between plates P, usually HF voltage, in order to initiate a glow discharge. In the plasma generated by the glow discharge, some of the starting substances introduced are activated, that is, are split into chemically active substances which produce the desired film material by reaction with one another or with the surface to be coated.

The samples whose surfaces are to be coated are here protected by the tunnel-shaped shield T against the direct effect of the plasma. The active substances generated in the plasma are transported underneath the shield by a gas stream, which is introduced by being pumped in and is oriented toward the gas discharge pipe come in contact with the surfaces to be coated. With this apparatus, it becomes possible to produce in a simple manner dielectric films which exhibit no damage and are excellently suitable, for example, for the passivation of semiconductor surfaces or for use as diffusion masks.

In order to make the layer structure variable, for example, so as to be able to operate with shielding in the initial phase of the coating process and later, in order to save time, in direct contact with the plasma, it is of advantage to make the tunnel-shaped shield movable, enabling it to be removed during the coating process.

Figure 2:
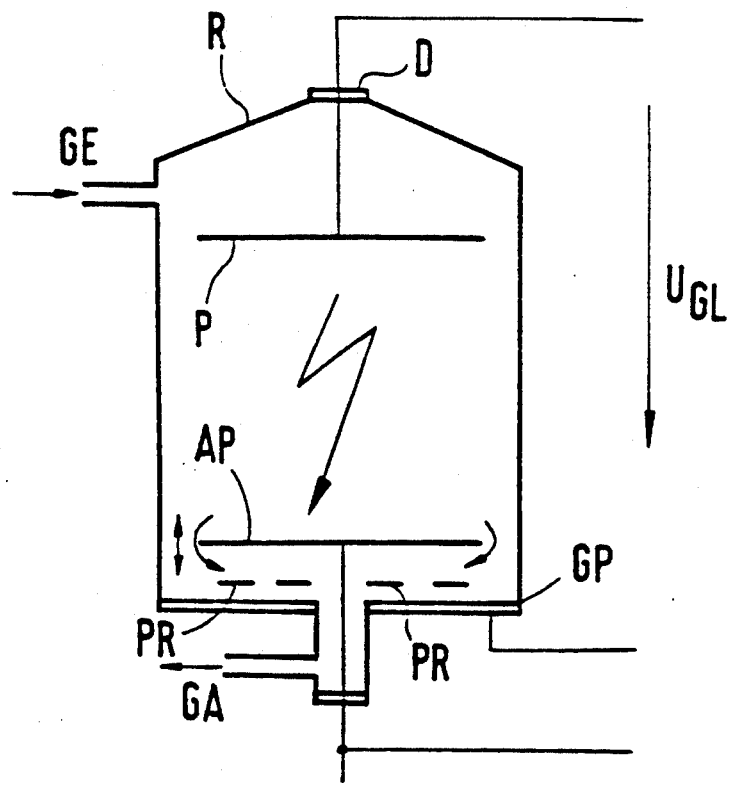
FIG. 2 shows the apparatus according to the invention including a parallel plate reactor in vertical arrangement and a plate-shaped shield.

Better yet, the apparatus shown in FIG. 2 can be adapted to a desired course of the coating process.

In the reaction vessel R shown in FIG. 2, a plate P of the parallel plate reactor is accommodated in the upper portion of the vessel. Base plate GP acts as counterplate.

The samples disposed closely above the base plate are protected against the direct influence of the plasma by a height adjustable, planar shielding plate AP. The shielding plate takes up almost the entire cross-section of the reaction vessel.

The shielding plate may be electrically connected with the base plate, but may also remain without electrical connection. Without an electrical connection, the shielding plate, depending on its set position within the glow discharge, takes on the potential existing there. By vertically adjusting the position of the shielding plate from a position within the dark area of the glow discharge forming above the base plate until it contacts the counterplate P disposed in the upper portion of the reaction vessel, the contact of the surfaces to be coated with the plasma can be varied as desired from total shielding (e.g. at the beginning of the coating process) to unprotected exposure. The apparatus may also be operated, for example, alternatingly as a remote reactor and as a direct plasma reactor.

If the movable shielding plate AP is provided with an electrical terminal leading to the outside of the reaction vessel, it may be brought to any desired potential during the coating process. Placed at the potential of counterplate P, it may itself become the plasma excitation electrode. Counterplate P then serves as a dark area shield for the upper region of the reaction vessel which is not part of the plasma area.

It will be understood that the above description of the present invention is susceptible to various modifications, changes and adaptations, and the same are intended to be comprehended within the meaning and range of equivalents of the appended claims.

What is claimed is:

1. An apparatus for depositing a dielectric film to a surface of a sample comprising:
   a reaction vessel;
   an inlet pipe and an extraction pipe each connected to the reaction vessel;
   parallel electrode plates disposed in the reaction vessel for generating a plasma, electrical terminals connected to the electrode plates leading outside of the reaction vessel; and
   a metal shielding plate disposed between the plasma and the extraction pipe, a substantially plasma-free area thus being created on the side of the shielding plate facing away from the plasma, the surface of the samples to be coated being disposed in the plasma-free area;
   wherein the shielding plate is in the shape of a tunnel which covers the extraction pipe, the interior of the tunnel-shaped shielding plate providing room to accommodate the samples.

2. An apparatus according to claim 1, wherein one of the parallel electrode plates comprises a base plate of the reaction vessel into which the extraction pipe is connected and on which rests the tunnel-shaped shielding plate.

3. An apparatus according to claim 1, wherein the tunnel-shaped shielding plate is displaceably or removably disposed and can be moved during depositing of the film.

4. An apparatus according to claim 2, wherein the tunnel-shaped shielding plate is displaceably or removably disposed and can be moved during depositing of the film.

5. An apparatus according to claim 1, further comprising an additional inlet pipe which opens into the reaction vessel in the region of the plasma-free area.

6. An apparatus according to claim 2, further comprising an additional inlet pipe which opens into the reaction vessel in the region of the plasma-free area.

7. An apparatus according to claim 3, further comprising an additional inlet pipe which opens into the reaction vessel in the region of the plasma-free area.

8. An apparatus according to claim 4, further comprising an additional inlet pipe which opens into the reaction vessel in the region of the plasma-free area.

9. An apparatus according to claim 1, further comprising an electrical terminal connected to the shielding plate and leading outside of the reaction vessel.

10. An apparatus for depositing a dielectric film to coat a surface of a sample comprising:
    a reaction vessel;
    an inlet pipe and an extraction pipe each connected to the reaction vessel;
    parallel electrode plates disposed in the reaction vessel for generating a plasma, electrical terminals connected to the electrode plates leading outside of the reaction vessel; and
    a metal shielding plate disposed between the plasma and the extraction pipe, a substantially plasma-free area thus being created on the side of the shielding plate facing away from the plasma, the surface of the samples to be coated being disposed in the plasma-free area.

11. An apparatus according to claim 10, wherein the shielding plate is essentially planar and fills almost the entire cross-section of the reaction vessel.

12. An apparatus according to claim 11, wherein the distance of the shielding plate from the surface to be coated can be varied during the depositing process.

13. An apparatus according to claim 12, further comprising an electrical terminal connected to the shielding plate and leading outside of the reaction vessel.

14. An apparatus according to claim 11, further comprising an additional inlet pipe which opens into the reaction vessel in the region of the plasma-free area.

15. An apparatus according to claim 12, further comprising an additional inlet pipe which opens into the reaction vessel in the region of the plasma-free area.

16. An apparatus according to claim 13, further comprising an additional inlet pipe which opens into the reaction vessel in the region of the plasma-free area.

17. An apparatus according to claim 10, further comprising an additional inlet pipe which opens into the reaction vessel in the region of the plasma-free area.

* * * * *